US 10,680,443 B2
Jun. 9, 2020

(12) United States Patent
Ishikawa

(54) SOLAR POWER GENERATION SYSTEM

(71) Applicant: TSB CORPORATION, Chofu-shi, Tokyo (JP)

(72) Inventor: Katsuyuki Ishikawa, Chofu (JP)

(73) Assignee: TSB CORPORATION, Chofu-Shi, Tokyo (JP)

( * ) Notice: Subject to any disclaimer, the term of this patent is extended or adjusted under 35 U.S.C. 154(b) by 480 days.

(21) Appl. No.: 14/902,149

(22) PCT Filed: Oct. 31, 2014

(86) PCT No.: PCT/JP2014/079142
§ 371 (c)(1),
(2) Date: Dec. 30, 2015

(87) PCT Pub. No.: WO2015/087638
PCT Pub. Date: Jun. 18, 2015

(65) Prior Publication Data
US 2016/0372929 A1 Dec. 22, 2016

(30) Foreign Application Priority Data

Dec. 12, 2013 (JP) .................. 2013-007058

(51) Int. Cl.
*H02J 1/00* (2006.01)
*H02J 3/00* (2006.01)
(Continued)

(52) U.S. Cl.
CPC ........ *H02J 3/383* (2013.01); *H01L 31/02021* (2013.01); *H02M 7/44* (2013.01);
(Continued)

(58) Field of Classification Search
CPC ..... H01L 31/02021; H02J 3/383; H02M 7/44; H02S 40/34; H02S 40/36; H02S 50/00; Y02E 10/50
(Continued)

(56) References Cited

U.S. PATENT DOCUMENTS 7,602,080 B1  10/2009  Hadar et al.
7,807,919 B2  10/2010  Powell et al.
(Continued)

FOREIGN PATENT DOCUMENTS

DE  10 2010 008 542 A1  8/2011
DE     202011105938 U1   10/2011
(Continued)

OTHER PUBLICATIONS

Extended European Search Report dated Jun. 13, 2017 in corresponding EP Application No. 14869075.3.

*Primary Examiner* — Rexford N Barnie
*Assistant Examiner* — Toan T Vu
(74) *Attorney, Agent, or Firm* — Birch, Stewart, Kolasch & Birch, LLP

(57) ABSTRACT

A solar power generation system is provided which can disconnect serial connection of a plurality of solar power generation panels in case of fire and prevent electric shock to a worker by water jetting. A solar power generation system 110 for converting solar energy to electric power includes a plurality of solar power generation panels 111 which is connected in series and a switch 115 which enables to disconnect or connect the serial connection of the plurality of solar power generation panels 111, and the switch 115 operates when receiving a specific control signal. This makes it possible to disconnect the serial connection of the plurality of solar power generation panels 111, and prevent electric shock to the worker by water jetting in case of fire.

5 Claims, 9 Drawing Sheets

(51) Int. Cl.
*H02J 3/38* (2006.01)
*H02S 40/34* (2014.01)
*H02S 40/36* (2014.01)
*H01L 31/02* (2006.01)
*H02M 7/44* (2006.01)
*H02S 50/00* (2014.01)

(52) U.S. Cl.
CPC .............. *H02S 40/34* (2014.12); *H02S 40/36* (2014.12); *H02S 50/00* (2013.01); *Y02E 10/50* (2013.01)

(58) Field of Classification Search
USPC .................................. 307/78, 43, 77, 80, 82
See application file for complete search history.

(56) References Cited

U.S. PATENT DOCUMENTS

| | | | |
|---|---|---|---|
| 7,884,278 B2 | 2/2011 | Powell et al. | |
| 8,337,221 B1 | 12/2012 | Huang et al. | |
| 8,823,218 B2 | 9/2014 | Hadar et al. | |
| 8,837,098 B2 | 9/2014 | Victor et al. | |
| 8,859,884 B2 | 10/2014 | Dunton et al. | |
| 8,860,241 B2 | 10/2014 | Hadar et al. | |
| 8,860,246 B2 | 10/2014 | Hadar et al. | |
| 8,933,321 B2 | 1/2015 | Hadar et al. | |
| 9,620,956 B2 | 4/2017 | Jankowski | |
| 2001/0023703 A1* | 9/2001 | Kondo | H01L 31/02021 136/244 |
| 2009/0114263 A1 | 5/2009 | Powell et al. | |
| 2009/0133736 A1 | 5/2009 | Powell et al. | |
| 2010/0082171 A1* | 4/2010 | Takehara | H04L 41/0659 700/286 |
| 2010/0127570 A1 | 5/2010 | Hadar et al. | |
| 2010/0127571 A1 | 5/2010 | Hadar et al. | |
| 2010/0139734 A1 | 6/2010 | Hadar et al. | |
| 2011/0025130 A1* | 2/2011 | Hadar | H01L 31/02021 307/80 |
| 2011/0061713 A1 | 3/2011 | Powell et al. | |
| 2011/0088741 A1 | 4/2011 | Dunton et al. | |
| 2011/0218687 A1 | 9/2011 | Hadar et al. | |
| 2011/0234149 A1* | 9/2011 | Hoshi | B60L 8/003 320/101 |
| 2012/0055529 A1* | 3/2012 | Hung | H01L 31/02021 136/244 |
| 2012/0125682 A1 | 5/2012 | Lu et al. | |
| 2012/0139737 A1* | 6/2012 | Gross | H01L 31/02021 340/635 |
| 2013/0057989 A1 | 3/2013 | Victor et al. | |
| 2013/0058140 A1 | 3/2013 | Victor et al. | |
| 2014/0259999 A1* | 9/2014 | Rodrigues | E04D 13/00 52/173.3 |
| 2014/0301003 A1 | 10/2014 | Jankowski | |
| 2015/0028683 A1 | 1/2015 | Hadar et al. | |
| 2015/0053250 A1 | 2/2015 | Hadar et al. | |
| 2015/0061409 A1 | 3/2015 | Dunton et al. | |
| 2015/0101651 A1 | 4/2015 | Hadar et al. | |

FOREIGN PATENT DOCUMENTS

| | | |
|---|---|---|
| DE | 10 2011 018 972 A1 | 10/2012 |
| DE | 10 2011 110 682 A1 | 2/2013 |
| EP | 2 498 300 A1 | 9/2012 |
| FR | 2946797 A1 | 12/2010 |
| IT | MI20 110 982 A1 | 12/2012 |
| JP | 2002-91586 A | 3/2002 |
| JP | 2011-503846 A | 1/2011 |
| JP | 2013-530664 A | 7/2013 |
| TW | M410338 U | 8/2011 |
| TW | I415355 B | 11/2013 |
| WO | WO 2011/150918 A2 | 6/2012 |
| WO | WO2012/072277 * | 6/2012 |
| WO | WO 2012/072277 A1 | 9/2012 |

* cited by examiner

SOLAR POWER GENERATION SYSTEM

TECHNICAL FIELD

The present invention relates to a solar power generation system for converting solar energy to electric power.

BACKGROUND ART

A solar power generation panel for generating power by solar light has been known. For the solar power generation panel, a plurality of cells is connected in series in the panel, and each cell includes a semiconductor device formed by PN junction. The power generation system is constituted by further connecting a plurality of the solar power generation panels.

For this type of solar power generation panels, technologies to improve safety have been developed. For example, the solar power generation panel described in Patent Document 1 includes a switch which is connected between a solar power generation cell and a connector outputting energy, thus making it possible to disconnect the connection during installation of the solar power generation panel and connect after the installation by the switch. This prevents connectors, connection boxes, and other electric components from receiving damages by arc discharge caused by connection and disconnection of a plug to which a voltage is applied.

CITATION LIST

Patent Document

PTL 1: Japanese Patent Laid-Open No. 2011-503846

SUMMARY OF INVENTION

Technical Problem

The technology described in Patent Document 1 is intended to improve the safety in installation of a solar power generation panel. On the other hand, safety problems may occur even after the installation of the solar power generation panel. For example, a fire may occur around or in the solar power generation system. In such a case, the firefighting should be started as soon as possible, but the normally operating solar power generation panel does not stop generation of a voltage.

Therefore, if a worker during the firefighting operation jets water to the solar power generation panel, electricity generated by the solar power generation panel flows through the water, and then the worker may receive an electric shock. Moreover, since there is a risk of such electric shock, the worker cannot jet water even upon request, and has nothing to do but wait for the solar power generation panel to be burned out.

The present invention was made in view of these circumstances and has an object to provide a solar power generation system which can disconnect serial connection of the plurality of solar power generation panels in case of fire and can prevent electric shock to a worker by water jetting.

Solution to Problem (1) In order to achieve the object, a solar power generation system of the present invention is a solar power generation system for converting solar energy to electric power, includes a plurality of solar power generation panels connected in series and a switch which enables to disconnect or connect serial connection of the plurality of solar power generation panels, wherein the switch operates when receiving a specific control signal. As a result, the solar power generation system disconnects serial connection of the plurality of solar power generation panels in case of fire, and prevents a worker from receiving electric shock by water jetting. To disconnect the serial connection of the plurality of solar power generation panels means that the serial connection of a power generation function is divided into a plurality of sections regardless of a disconnection position.

(2) Moreover, in the solar power generation system of the present invention, the switch, when receiving an input signal from an outside which is generated, triggered by an operation, as the specific control signal, disconnects or connects the serial connection of the plurality of solar power generation panels in accordance with the input signal. As a result, when a fire occurs, the serial connection of the solar power generation panels can be disconnected from the outside by an intension of the worker.

(3) Moreover, in the solar power generation system of the present invention, the switch is provided at a position where the serial connection of the plurality of solar power generation panels can be disconnected so that an accumulated voltage in the serial connection is 200 V or less in each section. By disconnecting the serial connection of the solar power generation panels so that the voltage does not become larger than even a voltage of a household power supply, an electric current flowing through a human body during water jetting to the fire and electric shock can be prevented.

(4) Moreover, the solar power generation system of the present invention is characterized in that the switch is provided on a connecting line for connecting terminals of the solar power generation panels to disconnect and connect the connecting line by a control signal transmitted by a control line connected in parallel with the connection line. As a result, connection at a plurality of spots can be disconnected once by control from the outside, and an operation can be facilitated.

(5) Moreover, the solar power generation system of the present invention is characterized that the connection line is formed as a connector that can be connected to the terminal of the solar power generation panel. As a result, a system can be configured in which the serial connection of the solar power generation panels can be easily disconnected by connecting the connection line to the conventionally used solar power generation panel by the connector.

Advantageous Effects of Invention

According to the present invention, in case of fire, the serial connection of the plurality of solar power generation panels can be disconnected, and electric shock to the worker by water jetting can be prevented.

DESCRIPTION OF EMBODIMENTS

Figure 1:
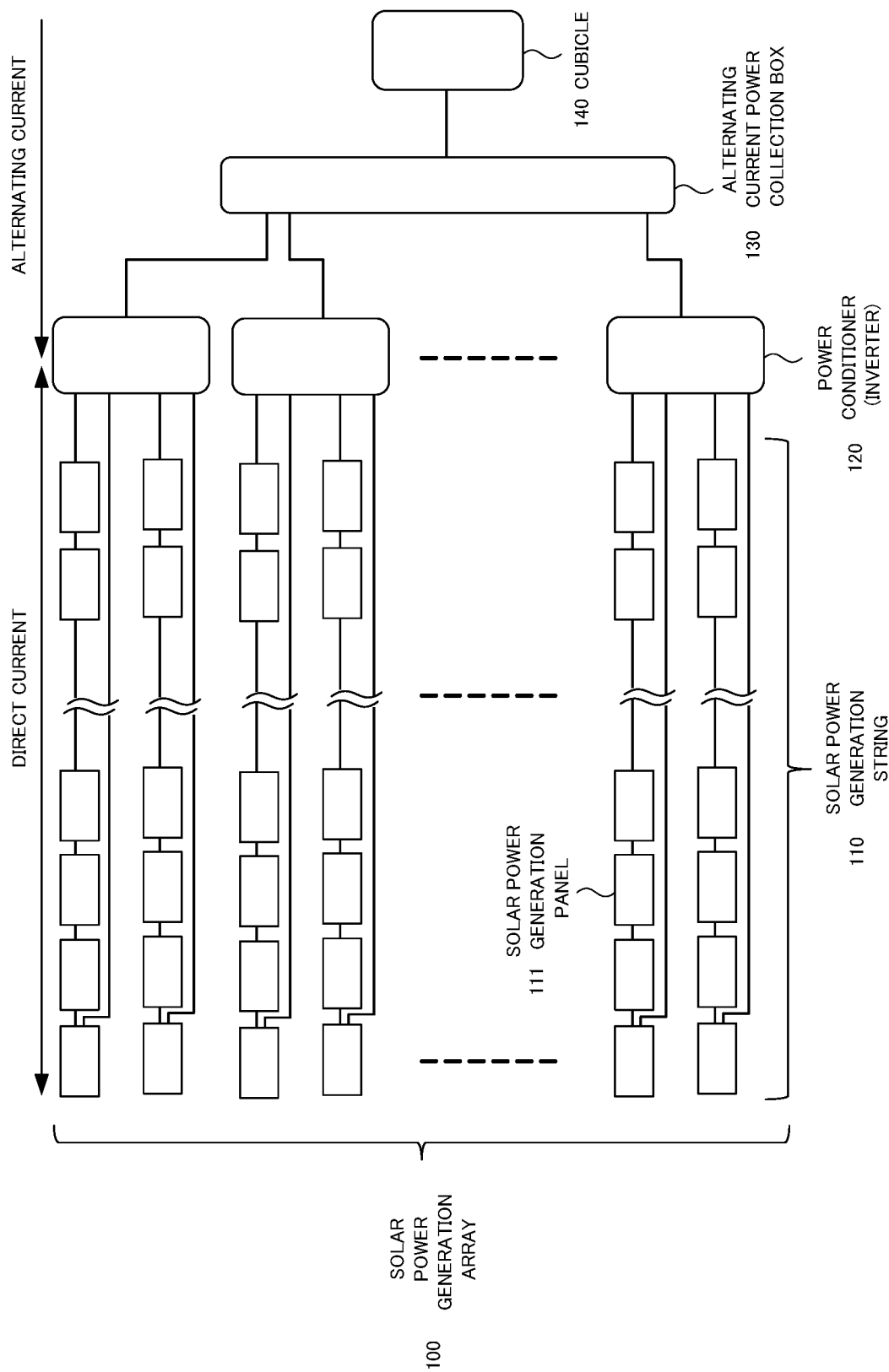
FIG. 1 is a block diagram illustrating a solar power generation array of a first embodiment.

Subsequently, the embodiments of the present invention will be described by referring to the attached drawings. To facilitate understanding of the description, the same reference numerals are given to the same constituent elements in each drawing, and duplicated description will be omitted.

First Embodiment

FIG. 1 is a block diagram illustrating a solar power generation array 100. The solar power generation array 100 includes a solar power generation string 110 (solar power generation system), a power conditioner 120, an alternating current power collection box 130, and a cubicle 140.

The solar power generation string 110 is constituted by connecting solar power generation panels 111 in series and converts solar energy into electric power. The solar power generation panels 111, which is also called a solar power generation module, has a plurality of solar cells connected therein, is applied with waterproof treatment or the like, and is formed as a panel with metal frames attached. In the solar power generation string 110, a switch for disconnecting serial connection of the solar power generation panels 111 is provided.

The power conditioner 120 is a type of inverter which converts a direct current flowing from the solar power generation string 110 to an alternating current so that it can be used in an environment such as home. The power conditioner 120 has a function of adjusting unstable inputs of voltage or current to stable outputs. It is preferable to design such that an operation portion is provided in the power conditioner 120 so that ON/OFF of the switch can be controlled.

The alternating current power collection box 130 collects outputs of the solar power generation strings 110 in alternating current via the power conditioner 120 and outputs them to the cubicle 140. The cubicle 140 boosts an output voltage from the alternating current power collection box 130 to a voltage which is adapted to a system intended for selling the electricity or the like. The cubicle 140 includes instruments to measure and display voltage and the like, switches to perform switching of circuits, protective devices to perform protection, overvoltage suppression and the like of devices at occurrence of an overcurrent, and a transformer to transform a voltage.

Figure 2:
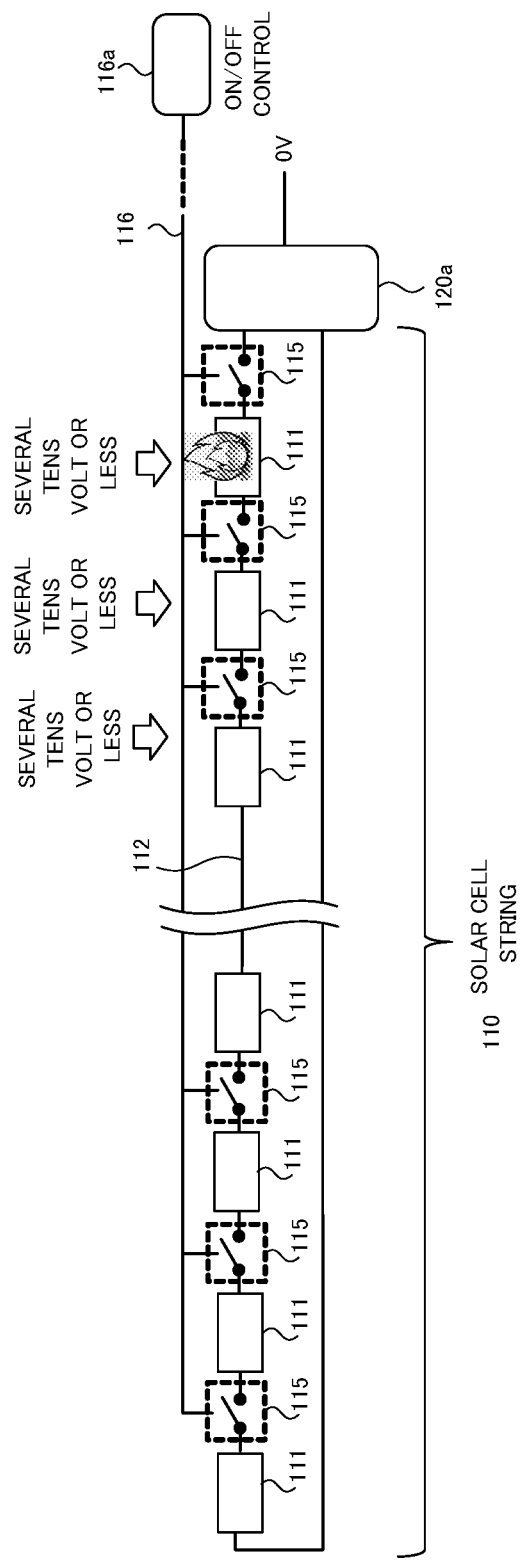
FIG. 2 is a block diagram illustrating a solar power generation system and a power conditioner body of the first embodiment.

FIG. 2 is a block diagram illustrating the solar power generation string 110 (solar power generation system) in which the switch to disconnect the serial connection is provided on wiring and a power conditioner body 120*a*. The solar power generation string 110 includes the plurality of solar power generation panels 111, a connection line 112, and a switch 115. The connection line refers to a line constituting the serial connection of a power generation function.

The solar power generation string 110 has the plurality of solar power generation panels ill serially connected by the connection line 112, boosts a direct current voltage converted from solar energy in the solar power generation panels 111 to a high voltage in the serial connection and outputs it to the power conditioner body 120*a*. The switch 115 is provided for the connection line 112 and enables to disconnect the serial connection of the plurality of solar power generation panels 111.

An operation portion 116*a* receives an operation and sends a control signal for controlling the switch 115. An ON/OFF operation received by the operation portion 116*a* is transmitted to the switch 115 by a control line 116, and whereby the switch 115 is turned ON/OFF. This makes it possible to disconnect the serial connection of the plurality of solar power generation panels 111, and prevent electric shock to the worker by water jetting in case of fire.

The switch 115 is preferably provided at a position where the serial connection of the plurality of solar power generation panels is disconnected so that the voltage accumulated in the serial connection becomes 200 V or less in each section. By disconnecting the serial connection of the solar power generation panels so that the voltage does not become larger than even a voltage of a household power supply, an electric current flowing through a human body during water jetting in a fire and electric shock can be prevented.

The switch 115 is further preferably provided so that the voltage accumulated in the serial connection becomes 100 V or less in each section. In an example illustrated in FIG. 2, since the switch 115 is provided in each solar power generation panels 111 and the connection can be disconnected, the voltage accumulated in each section of the disconnected serial connection becomes several tens of volts or less.

The switch 115 is provided on the connection line 112 connecting terminals of the solar power generation panels 111 and disconnects and connects the connection line 112 by a signal transmitted by the control line 116 connected in parallel with the connection line 112. This makes it possible to disconnect the connection at plural spots once by control from the outside, and to facilitate an operation. For example, the switch 115 can be designed so as to be turned ON when the signal from the outside is at a High Level. In the example, the switch 115 to disconnect the connection is provided at each solar power generation panels 111, but the switch 115 may be provided at each string of the plurality of solar power generation panels 111.

Figure 3A:
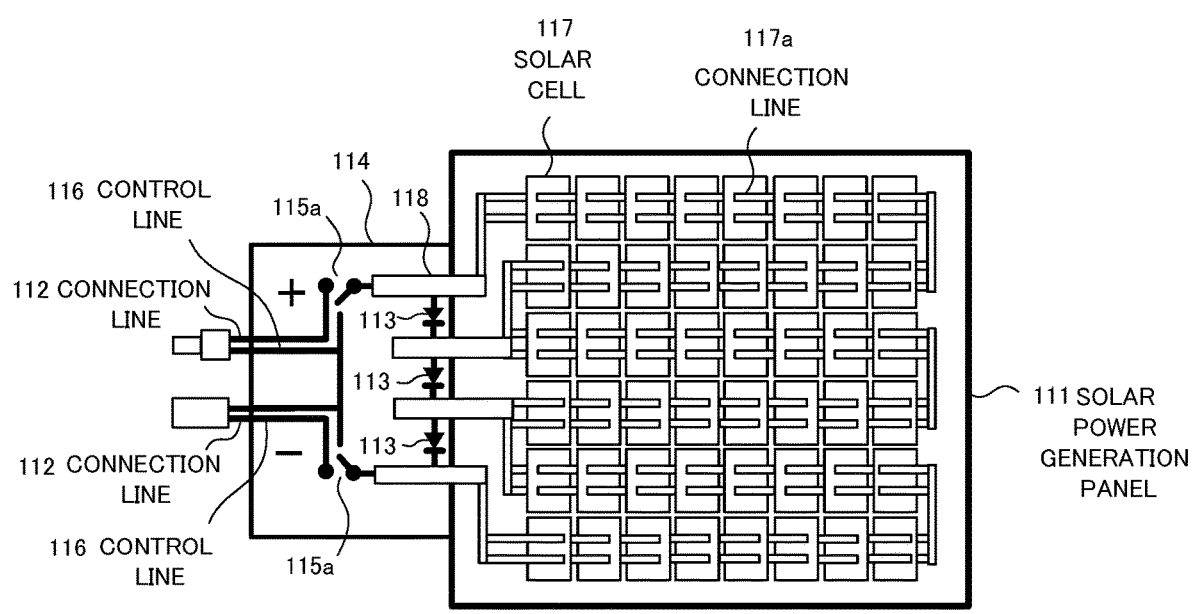
FIGS. 3A to 3C show an example of how to provide a switch for the connection of the solar power generation panels.
Figure 3B:
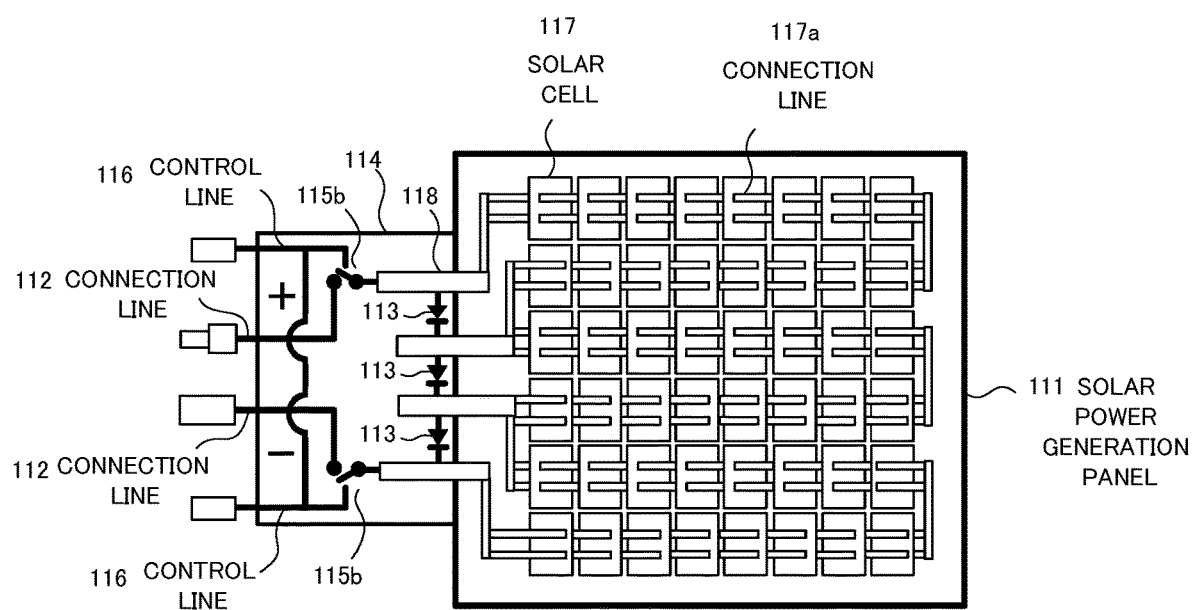
Figure 3C:
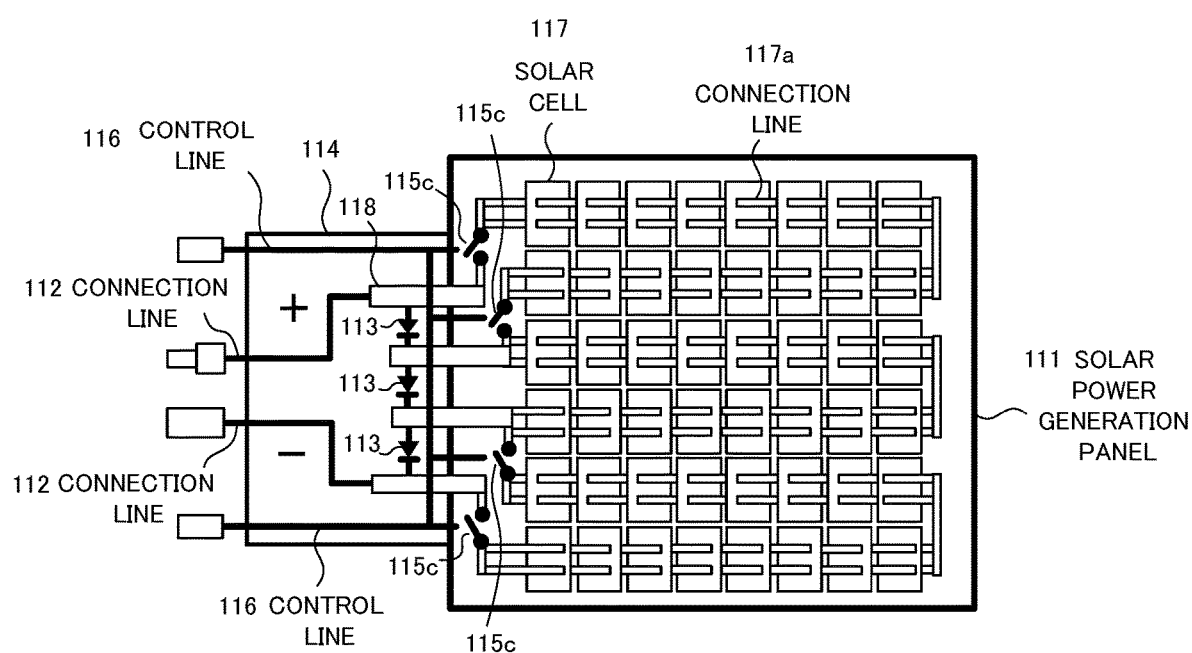

FIGS. 3A to 3C are examples of how to provide the switch to connect the solar power generation panels 111, respectively. In any one of the examples illustrated in FIGS. 3A to 3C, a connection structure of a solar cell 117 in the solar power generation panels 111 is the same, and in the solar power generation panels 111, a plurality of the solar cells 117 is connected in series using two connection lines 117*a*. The solar cell 117 is a semiconductor device in which PN junction is formed on a silicon wafer and generates an electric current when it is exposed to sunlight.

The examples illustrated in FIGS. 3A to 3C show states of the solar cells 117 when seen from a light receiving surface side. Two connection lines 117*a* connected from the light receiving surface of the solar cell 117 to a back surface are connected with one tip ends of a large number of thin lines, which are provided such that the other tip ends are connected widely on the light receiving surface and collect the electric current. On the other hand, the back surface of the solar cell 117, since it does not have to receive light, provides uniform electrodes on the whole surface of the back surface of the solar cell 117. Two connection lines 117*a* are preferable in efficiency, but one line is acceptable.

A bypass diode 113 is provided so as to connect terminals 118 for every predetermined number of serially connected solar cells 117. The bypass diode 113, even if a defect occurs in a part of the solar cells 117, functions as a bypass for allowing the electric current to flow by avoiding a defective portion. This makes it possible to prevent damage of the defect from spreading over the entire solar power generation panels 111.

A junction box 114 is provided integrally with the solar power generation panels 111 and has a function of a connector to connect a connection line 112 cable to the terminal 118 of the solar power generation panels 111. The junction box 114 is preferably arranged on the back surface of the solar power generation panels 111.

The solar cell 117 is always in a power generation state, when it is exposed to light. In such a state, a part of the solar power generation string 110 or a part of electrode (active portion) of the solar power generation panels 111 is exposed due to a fire or the like, a water jetting operator gets electric shock through water by water jetting for firefighting. By providing the switches 115a to 115c, such an accident can be prevented, and an output voltage of the solar power generation string 110 or an output voltage of the section, on which water may splash, of the solar power generation panels 111 can be lowered.

The solar power generation string 110 is usually formed by connecting the plurality of solar power generation panels 111 in series so as to generate a voltage of several hundred Volt. The switch for turning ON/OFF using an external signal is provided inside the solar power generation panels 111 or at a connection portion between the solar power generation panels 111.

As a result, by disconnecting the serial connection to the single solar power generation panels 111 or the small-scale solar power generation string 110 (with the output voltage at 100 V or less), the output voltage of the solar power generation string 110 can be lowered.

The output voltage in the single solar power generation panels 111 is different depending on the case but it is usually several tens volt or less, therefore there is no risk of electric shock by water jetting, and the fire can be handled similarly to a fire of an ordinary house.

In the example illustrated in FIG. 3A, the switch 115a is provided at a terminal portion of the solar power generation panels 111, and ON/OFF control of the switch 115a is performed by the control line 116 which is connected to the connection line 112 in parallel. Moreover, the control line 116 controlling the switch 115a is provided to integrate by a cable to extract electric power of the solar power generation panels 111, and the control line 116 and the connection line 112 are connected to the solar power generation panels 111 by the same cable. When the switch 115a is turned OFF, serial connection of solar power generation panels 111 of each is disconnected.

In the example illustrated in FIG. 3B, the switch 115b is provided at the terminal portion of the solar power generation panels 111, and ON/OFF control of the switch 115b is performed by the control line 116 which is connected to the connection line 112 in parallel. This is similar to the example illustrated in FIG. 3A in these points. However, the connection line 112 and the control line 116 are connected to the solar power generation panels 111 by cables which are different from each other.

In the example illustrated in FIGS. 3A and 3B, the connection line 112 being provided in the junction box 114 can be formed as a connector which enables to be connected to a terminal of the solar power generation panels 111. As a result, by connecting the connection line 112 to the solar power generation panels 111 which has been used conventionally using the terminal by the junction box 114, a system which can be disconnected easily the serial connection by the solar power generation panels 111 can be provided.

In the example illustrated in FIG. 3C, each of the four switches 115c is provided for each serial connection of the plurality of solar cells 117 in the solar power generation panels 111, and when the switch 115c is turned OFF, the connection is disconnected for each serial connection of the plurality of solar cells 117. Therefore, in this case, the disconnected section in the serial connection becomes shorter and the voltage becomes lower than those in the examples in FIGS. 3A and 3B. In this case also, the turning ON/OFF control of the switch 115c is performed by the control line 116 which is connected to the connection line 112 in parallel. Moreover, the connection line 112 and the control line 116 are connected to the solar power generation panels 111 using different cables, but may be connected using the same cable.

In the examples illustrated in FIGS. 3A to 3C, the switches 115a to 115c are provided integrally with the solar power generation panels 111. In case of the solar power generation panels 111 being serially connected, the control line 116 is preferably provided with a wiring facility capable of connection with a daisy chain. As a result, the solar power generation panels 111 can be provided in accordance with the scale.

Figure 4:
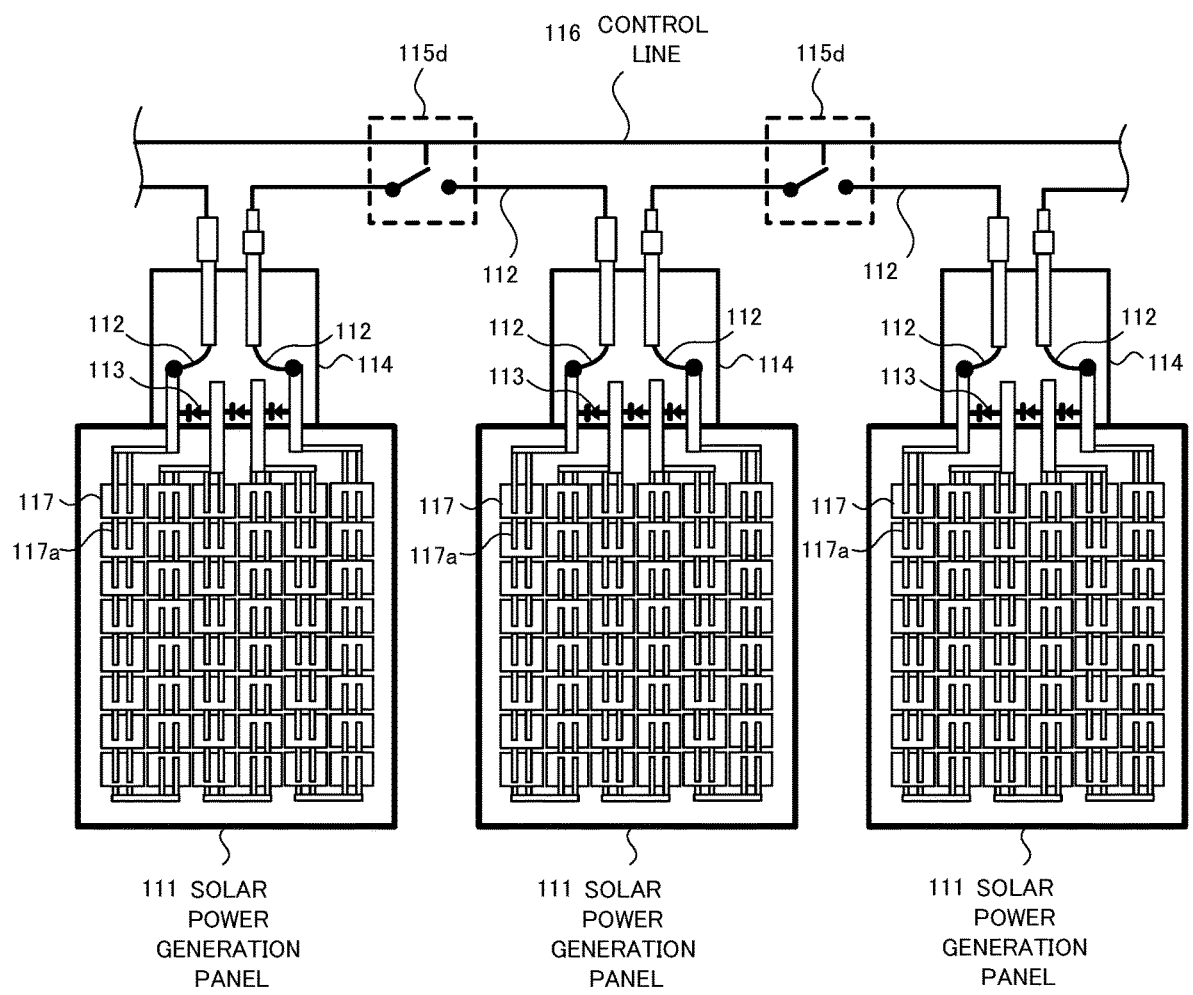
FIG. 4 is another example of how to provide the switch for the connection of the solar power generation panels.

FIG. 4 is a view illustrating another example of how to provide a switch to the connection of the solar power generation panels 111. In the example illustrated in FIG. 4, the switch 115d is provided outside of the solar power generation panels 111 and the junction box 114. The ON/OFF control of the switch 115d is performed by the control line 116 which is connected to the connection line 112 in parallel. When the switch 115d is turned OFF, the serial connection is disconnected in solar power generation panels 111 of each.

In the example illustrated in FIG. 4, the switch 115d is provided in the middle of the connection line 112 between the solar power generation panels 111. Therefore, wiring which includes the switch 115 can be easily mounted on the solar power generation array 100 which is used now.

Second Embodiment

Figure 5:
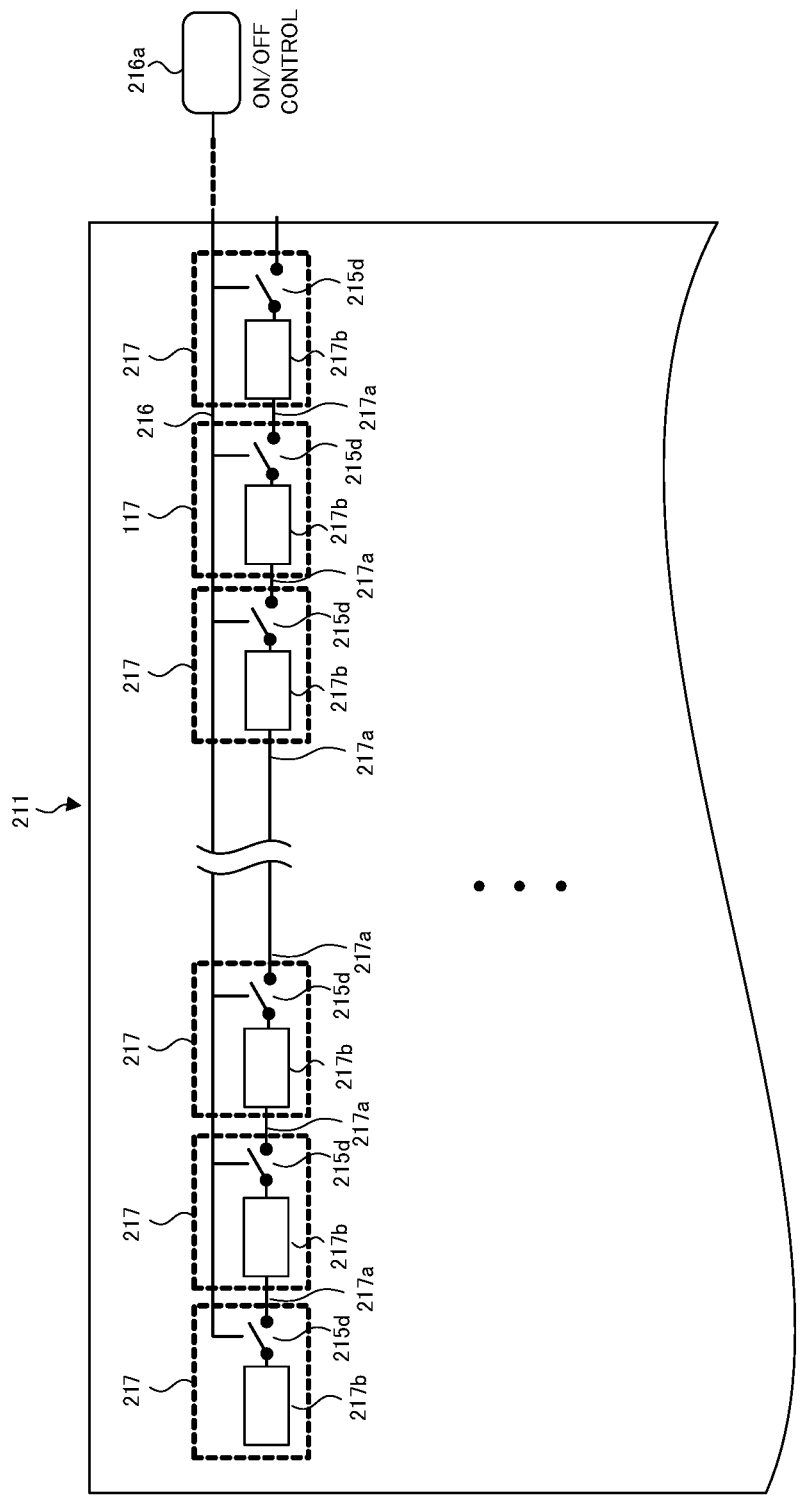
FIG. 5 is the block diagram illustrating a solar power generation system of a second embodiment.

In the embodiment, the switch is provided for each solar power generation panels 111 or for each serial connection of the plurality of solar cells 117, but the switch may be provided as a device structure in the solar cell 117. FIG. 5 is a block diagram illustrating a solar power generation panel 211 in which a switch is provided in the solar cell.

As illustrated in FIG. 5, the solar power generation panel 211 is formed by a connection of solar cells 217 using a connection line 217a. The solar cell 217 is composed of a semiconductor device formed by PN-junction on a silicon wafer, and a switch 215d and a power generation portion 217b is provided in the semiconductor device.

In the solar cell 217, when an OFF control signal is transmitted to the switch 215d through a control line 216 from an operation portion 216a, the switch 215d disconnects serial connection of the solar cell 217 for each solar cell 217. As a result, the serial connection of the solar cells is disconnected by the switch in the solar power generation panels 111, and a voltage in the disconnected section can be lowered.

Third Embodiment

In the solar power generation array of the above embodiment, a direct current which is generated by the solar power generation string is converted to an alternating current and then the current is collected and outputted to the cubicle, but it may be a solar power generation array in which a direct current which is generated in the solar power generation string is first collected and in a rear stage, the direct current is converted to an alternating current and outputted to the cubicle.

Figure 6:
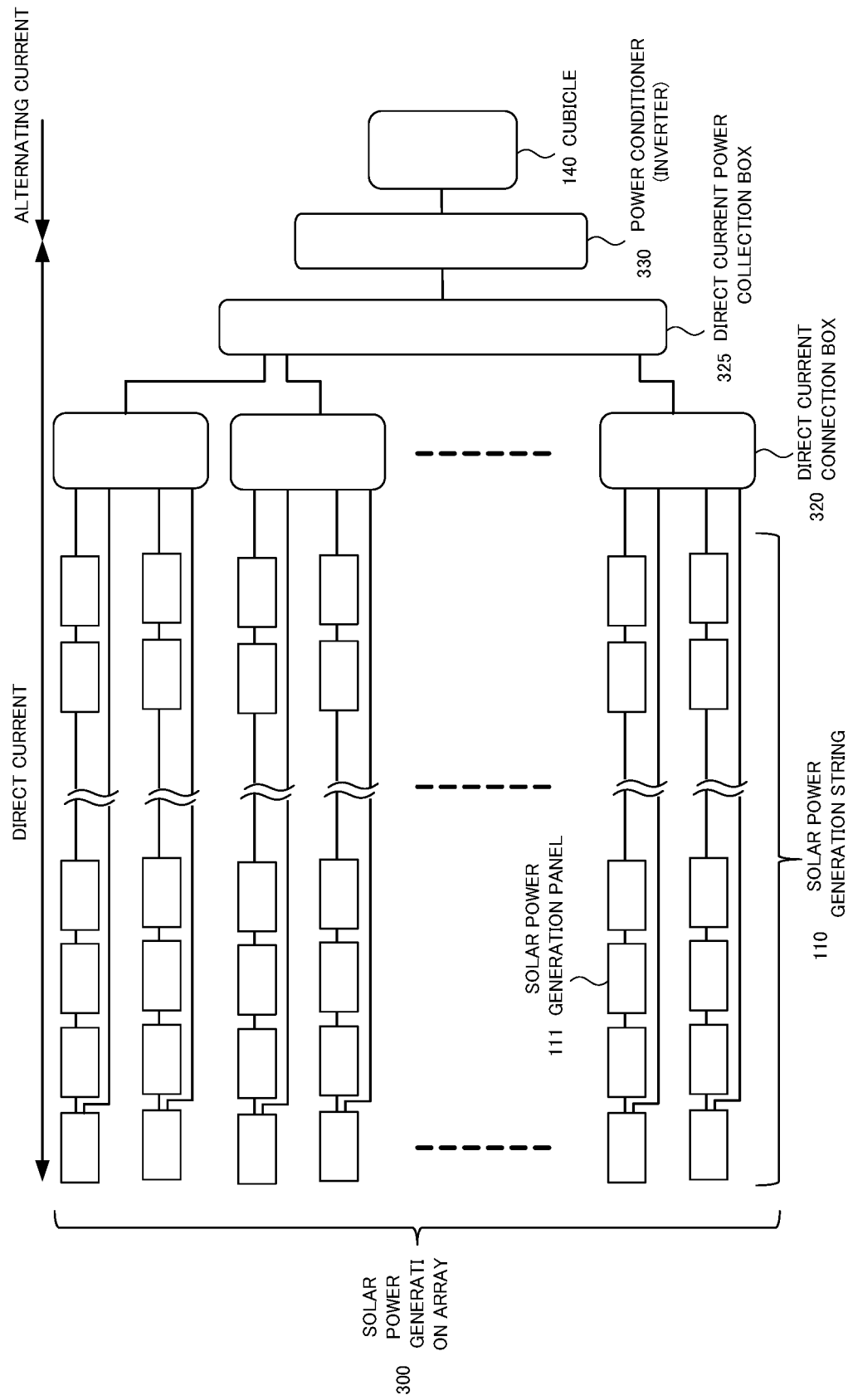
FIG. 6 is a block diagram illustrating a solar power generation array of a third embodiment.

FIG. 6 is a block diagram illustrating a solar power generation array 300. The solar power generation array 300 includes the solar power generation string 110 (solar power generation system), a direct current connection box 320, a direct current power collection box 325, a power conditioner 330, and the cubicle 140.

The direct current connection box 320 outputs a direct current which is generated in the solar power generation string 110 to the direct current power collection box 325. The direct current power collection box 325 collects an output of the solar power generation string 110 in direct current via the direct current connection box 320 and outputs it to the power conditioner 330. The power conditioner 330 converts the input direct current to an alternating current so that it can be used in an environment such as a household and outputs it to the cubicle 140. The cubicle 140 raises the output voltage to a voltage satisfying the purpose.

Figure 7:
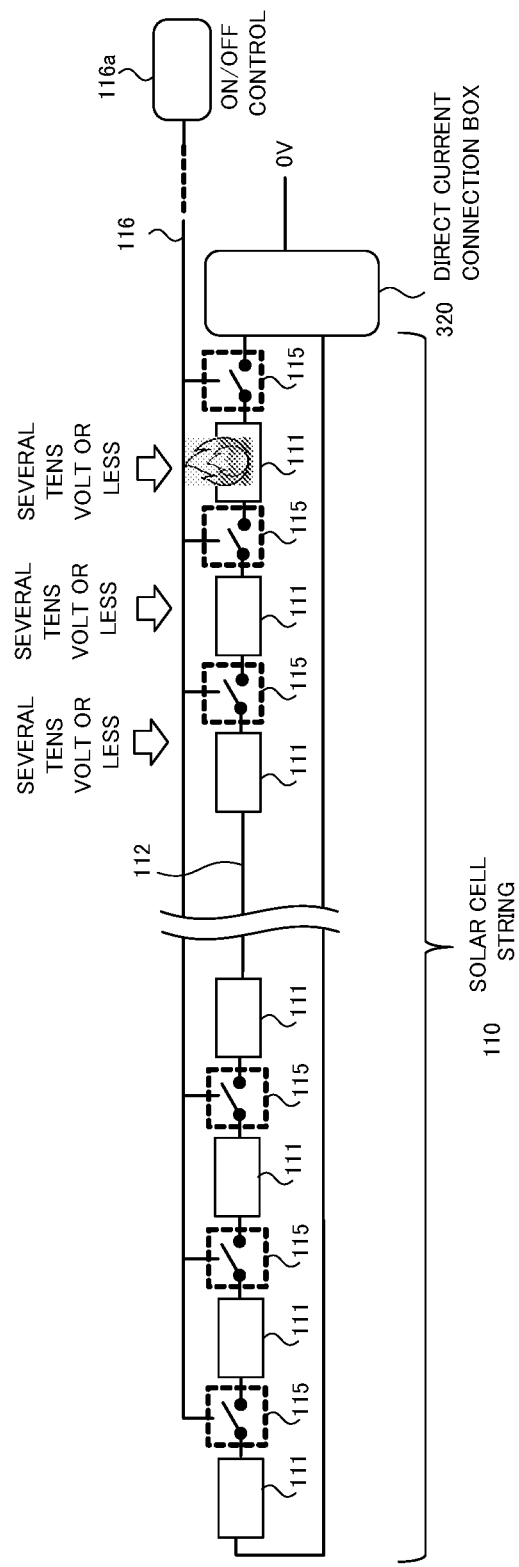
FIG. 7 is a block diagram illustrating a solar power generation system and a direct current connection box of the third embodiment.

FIG. 7 is a block diagram illustrating the solar power generation string 110 (solar power generation system) in which a switch for disconnecting serial connection in a wiring is provided and the direct current connection box 320. The solar power generation string 110 includes a plurality of the solar power generation panels 111, the connection line 112, and the switch 115.

The solar power generation string 110 raises the direct current voltage which is converted from the solar energy in the solar power generation panels 111 in a high voltage by serial connection and outputs it to the direct current connection box 320. The switch 115 is provided in the connection line 112 and the switch 115 makes the serial connection by the plurality of solar power generation panels 111 disconnect in accordance with an operation from the operation portion 116a.

In the embodiment, the solar power generation string is described as the solar power generation system of the present invention, but the solar power generation array or the solar power generation panel can be also understood as the solar power generation system of the present invention.

Fourth Embodiment

In the solar power generation system of the embodiment, the switch connects or disconnects the serial array on the basis of the operation of turning ON/OFF which is received in the operation portion by the user, but the switch may connect or disconnect the serial array on the basis of an ON/OFF signal by a temperature sensor.

The solar power generation system of this embodiment is provided with a temperature sensor to detect a temperature of the plurality of solar panels. The switch which disconnects or connects the serial connection by the plurality of solar power generation panels in accordance with an output signal of the temperature sensor.

A connection between the temperature sensor and the switch in this case can be realized by replacing the operation portion 116a by the temperature sensor in the configuration illustrated in FIG. 2. Moreover, in the case of the configuration illustrated in FIG. 5, the operation portion 216a may be replaced by the temperature sensor and in the case of the constitution illustrated in FIG. 7, the operation portion 116a may be replaced by the temperature sensor.

At least one temperature sensor provided per solar power generation string functions and the temperature sensor is provided in the vicinity of any one of the solar panels. For example, the temperature sensor is preferably provided on a back side of the light receiving surface of any one of the solar panels. The temperature sensor may be formed on the back side of the light receiving surface together with circuits of a switch and the like.

The temperature sensor preferably transmits a signal to turn OFF the switch triggered by reaching a predetermined temperature at 100° C. or more and 200° C. or less. Although depending on an environment where the solar panel is used, the temperature usually reaches 70 to 80° C. at the highest, so it may be determined abnormality occurred when the solar panel reaches the temperature of 100° C. or more. Moreover, a temperature of 200° C. or less is preferable for reaction in combustion. Considering a variation during production, the switch is preferably turned ON/OFF based on a temperature within the above temperature range as a trigger. The predetermined temperature range is more preferably between 150° C. or more and 200° C. or less.

As described above, in any one of the embodiments of the present invention, the control line is provided separately from the connection line to transmit electricity for each solar power generation string, and the switch is turned ON/OFF by transmitting a signal to the control line. In the example of a circuit illustrated in FIG. 3A, the control line 116 is configured by being bundled integrally with the cable for power output, but even in this case, each line is provided independently.

On the other hand, a method of overlapping and transmitting signals from the power conditioner side to the cable which is used for sending electric power which is generated in the solar power generation panel can be employed. However, in such a method, in case that devices such as a power collection box and the like are arranged between a signal generator and the switch, the circuit may not function normally and the switch becomes uncontrollable.

In the present invention, surely stopping power transmission in an emergency such as occurrence of a fire is made much account of. The solar power generation system of the present invention, in case that the device is arranged between the signal generator and the switch, is more excellent than the system in which a power transmission line also works as the control line in a view of the switch can being reliably turned OFF.

REFERENCE SIGNS LIST 100 solar power generation array
110 solar power generation string
111 solar power generation panel
112 connection line
113 bypass diode
114 junction box
115, 115a to 115d switch
116 control line
116a operation portion
117 solar cell
117a connection line
118 terminal
120 power conditioner
120a power conditioner body
130 alternating current power collection box
140 cubicle 211 solar power generation panel
215d switch
216 control line
216a operation portion
217 solar cell
217a connection line
217b power generation portion
320 direct current connection box
325 direct current power collection box
330 power conditioner

The invention claimed is:

1. A solar power generation system for converting solar energy to electric power, comprising:
   a plurality of solar power generation panels connected in series, each solar power generation panel being connected to a connecting line via a junction box;
   a switch which enables to disconnect or connect serial connection of the plurality of solar power generation panels, the switch being provided for each of the plurality of solar power generation panels, the switch being provided outside of the solar power generation panels and junction boxes, and the switch being provided on the connecting line connecting terminals of elements, formed by the solar power generation panels and the junction boxes, to disconnect and connect the connecting line by receiving a specific control signal transmitted by a control line provided in parallel with the connecting line; and
   an operation portion provided in a power conditioner connected in series to the plurality of solar panels with the control line and making the switch operable, wherein
   by continuing to provide a single signal as the specific control signal from the outside to each control line, each said switch is kept to be turned ON to maintain the series connection of the solar power generation panels, and when the single signal is interrupted, each said switch is turned OFF and disconnects the series connection,
   each connecting line and each control line are paired such that one connecting line and one control line are bundled integrally within one cable.

2. The solar power generation system according to claim 1, wherein
   the switch, when receiving an input signal from an outside which is generated, triggered by an operation, as the specific control signal, disconnects or connects the serial connection of the plurality of solar power generation panels in accordance with the input signal.

3. The solar power generation system according to claim 1, wherein
   the switch is provided at a position where the serial connection of the plurality of solar power generation panels can be disconnected so that an accumulated voltage in the serial connection is 200 V or less in each section.

4. The solar power generation system according to claim 1, wherein
   the connecting line is formed as a connector that can be connected to the terminal of the solar power generation panel.

5. The solar power generation system according to claim 1, further comprising:
   a temperature sensor for detecting temperatures of the plurality of solar panels, wherein
   the switch disconnects or connects the serial connection of the plurality of solar power generation panels in accordance with an output signal of the temperature sensor.

* * * * *